United States Patent [19]

Rogers

[11] Patent Number: 5,300,832
[45] Date of Patent: Apr. 5, 1994

[54] VOLTAGE INTERFACING BUFFER WITH ISOLATION TRANSISTORS USED FOR OVERVOLTAGE PROTECTION

[75] Inventor: Alan C. Rogers, Palo Alto, Calif.

[73] Assignee: Sun Microsystems, Inc., Mountain View, Calif.

[21] Appl. No.: 974,100

[22] Filed: Nov. 10, 1992

[51] Int. Cl.⁵ ............... H03K 19/0185; H03K 19/003
[52] U.S. Cl. .................... 307/475; 307/443; 307/473; 307/296.5
[58] Field of Search ........... 307/443, 473, 475, 296.5, 307/451

[56] References Cited

U.S. PATENT DOCUMENTS

| | | | |
|---|---|---|---|
| 4,709,162 | 11/1987 | Braceras et al. | 307/475 |
| 4,782,250 | 11/1988 | Adams et al. | 307/473 |
| 4,825,102 | 4/1989 | Iwasawa et al. | 307/443 |
| 4,920,287 | 4/1990 | Hartgring et al. | 307/443 |
| 4,963,766 | 10/1990 | Lundberg | 307/451 |
| 4,996,443 | 2/1991 | Tateno | 307/475 |
| 5,019,720 | 5/1991 | Skoog et al. | 307/443 |
| 5,128,560 | 7/1992 | Chern et al. | 307/296.1 |

*Primary Examiner*—Edward P. Westin
*Assistant Examiner*—Benjamin D. Driscoll
*Attorney, Agent, or Firm*—Blakely Sokoloff Taylor & Zafman

[57] ABSTRACT

A voltage interfacing buffer for interfacing a low voltage integrated circuit to a high voltage environment, wherein the integrated circuit contains only low voltage transistors. To drive the high voltage environment at the low voltage swing, the voltage interfacing circuit employs protection circuits and novel n-well biasing of MOS transistors. To drive the high voltage environment at the high voltage swing, the voltage interfacing circuit employs a bias generator circuit to bias buffer transistors supplied with the high voltage. As example applications, the voltage interfacing buffer enables a 3 volt or 3.3 volt integrated circuit chip to drive TTL as well as CMOS voltage levels. Moreover, the voltage interfacing buffer enables a 2 volt integrated circuit chip to drive TTL voltage levels.

15 Claims, 5 Drawing Sheets

VOLTAGE INTERFACING BUFFER WITH ISOLATION TRANSISTORS USED FOR OVERVOLTAGE PROTECTION

BACKGROUND OF THE INVENTION

1. Field of the Invention

The present invention relates to the field of integrated circuits. More particularly, the present invention relates to interfacing integrated circuits to busses and circuits having higher voltage ranges.

2. Art Background

To achieve greater transistor densities and speeds for integrated circuits, circuits designers are reducing the physical dimensions of the transistors fabricated on the integrated circuits. Greater transistor densities enable implementation of greater functionality in an integrated circuit. However, as the physical dimensions of the transistors of an integrated circuit decreases, the supply voltage for the integrated circuit correspondingly decreases.

For example, metal oxide semi-conductor (MOS) transistors contained on newer generation high density integrated circuits are fabricated with smaller channel lengths than MOS transistors on older lower density integrated circuits. The gate oxides layers of the MOS transistors are reduced in width in accordance with the reduced channel length. However, the thinner gate oxide layers of the newer generation integrated circuits cannot withstand the high voltage levels of prior generations having thicker gate oxide layers.

As a consequence, the newer generation MOS integrated circuits operate with lower supply voltages than previous generations. For example, many newer generation MOS integrated circuits operate with a 3.3 V supply voltage rather than a 5 V supply voltage common in prior generations.

Nevertheless, in many applications an integrated circuit operating with a low supply voltage must interface with devices and buses operating at higher voltages. If a low voltage integrated circuit is coupled to a high voltage environment, the thin gate oxide layers of the low voltage MOS transistors gradually deteriorate. The gradual deterioration of the gate oxide layers leads to unreliability and ultimate failure of the integrated circuit.

Referring briefly to FIG. 1, a typical prior art tri-state input/output circuit for a pad of an integrated circuit is illustrated. An output data signal 101 is coupled to the gates of a transistor Q10 and a transistor Q12. An output enabled bar signal (OEB) 104 is coupled to control the gates of transistors Q11 and Q15. An output enable (OE) 105 is coupled to control the gates of transistors Q13 and Q14. The output circuit has a pull-up transistor Q16 and a pull-down transistor Q17. The n-well 106 of the transistor Q16 is coupled to the supply voltage VCC. The input circuit is comprised of a pull-up transistor Q18 and a pull-down transistor Q19.

For the prior art circuit to function properly, the supply voltage VCC must be greater than or equal to the voltage at an output pad 102, and the voltage at the output pad 102 must be greater than or equal to the voltage at a common node 107. Transistors contained in the prior art circuit are vulnerable to gate oxide layer breakdown if the output pad 102 is coupled to a bus or other circuit having higher voltage swings than the VCC supply voltage. The pull-up transistor Q18 and the pull-down transistor Q19 are vulnerable. Also, a conducting path exists from the drain of the transistor Q16, into the n-well 106 of the transistor Q16, and onto the VCC supply voltage node 100.

One prior technique of interfacing a low voltage integrated circuit to a high voltage environment is to employ an interface chip as a buffer between high and low voltage environments. However, such interface chips adds significant delays in signal transfer to and from the low voltage integrated circuit. Moreover, such an interface chip requires extra system board space and increases the cost of the system.

Another prior technique for interfacing low voltage devices to a high voltage environment is to fabricate high voltage transistors directly on the low voltage integrated circuit. The high voltage transistors interface directly to the high voltage environment, while protecting the low voltage transistors contained on the integrated circuit. However, such a solution requires extra process steps during integrated circuit fabrication in order to form the larger high voltage transistors. The extra steps increases the cost of fabrication and reduces the yield of the fabrication process. Also, such a solution requires that the integrated circuit chip be supplied with a higher voltage VCC for the outputs.

As will be described, the present invention is a voltage interfacing circuit for interfacing a low voltage integrated circuit to a high voltage environment, while implementing only low voltage transistors on the integrated circuit.

SUMMARY OF THE INVENTION

A voltage interfacing circuit for interfacing a low voltage integrated circuit to a high voltage environment, wherein the integrated circuit contains only low voltage transistors.

For one embodiment, the voltage interfacing buffer comprises an output circuit and an input circuit. The output circuit is coupled to a pad node having the high voltage swing. The output circuit drives the pad node and isolates the integrated circuit from the high voltage swing of the pad node. The output circuit comprises an output pull-down circuit and an output pull-up circuit. The output pull-down circuit driving the pad node to a low voltage and protects the integrated circuit from the high voltage swing of the pad node. The output pull-up circuit drives the pad node to the VCC supply voltage level of the integrated circuit, and protects the integrated circuit from the high voltage swing of the pad node. The MOS transistors of the output pull-up circuit have novel n-well biasing to maintain junction isolations.

The input circuit senses the voltage on the pad node, and isolates the integrated circuit from the high voltage swing of the pad node. The input circuit senses the pad node voltage through a protected node of the output pull-down circuit. The input circuit employs a feedback mechanism to restore full VCC voltage swing to the input signal.

An alternative embodiment of the voltage interfacing circuit enables an integrated circuit operating with a first VCC supply voltage to drive a circuit or bus at a higher VCC* voltage swing. The voltage interfacing circuit is comprised of a bias generator circuit, an output circuit, an input circuit, and level conversion circuits.

The bias generator circuit senses the supply voltages VCC and VCC*, and generates bias signal substantially equal to the difference between the VCC* and the VCC. The bias signal is used in protecting the transistors of the input and output circuits for interfacing with the high voltage environment.

The output circuit is coupled to a pad node having a voltage swing substantially equal to VCC*. The output circuit drives the pad node to the VCC* voltage swing, and uses the bias signal in protecting the integrated circuit from the VCC* voltage swing of the pad node. The input circuit senses a voltage on the pad node, and uses the bias signal in protecting the integrated circuit from the VCC* voltage swing.

An output level conversion circuit senses the bias signal, and converts between the VCC voltage swing of an output data node and the VCC* voltage swing of the pad. An input level conversion circuit senses the bias signal, and converts between the VCC voltage swing of an input data node and the VCC* voltage swing of the pad.

DETAILED DESCRIPTION OF THE INVENTION

A voltage interfacing circuit is disclosed for interfacing a low voltage integrated circuit to a high voltage environment, wherein the integrated circuit contains only low voltage transistors. In the following description for purposes of explanation specific transistors circuit devices, circuit architecture's, and components are set forth in order to provide a thorough understanding of the present invention. However, it will be apparent to one skilled in the art that the present invention may be practiced without the specific details. In other instances, well known circuits are shown in schematic form in order not to obscure the present invention unnecessarily.

Figure 1:
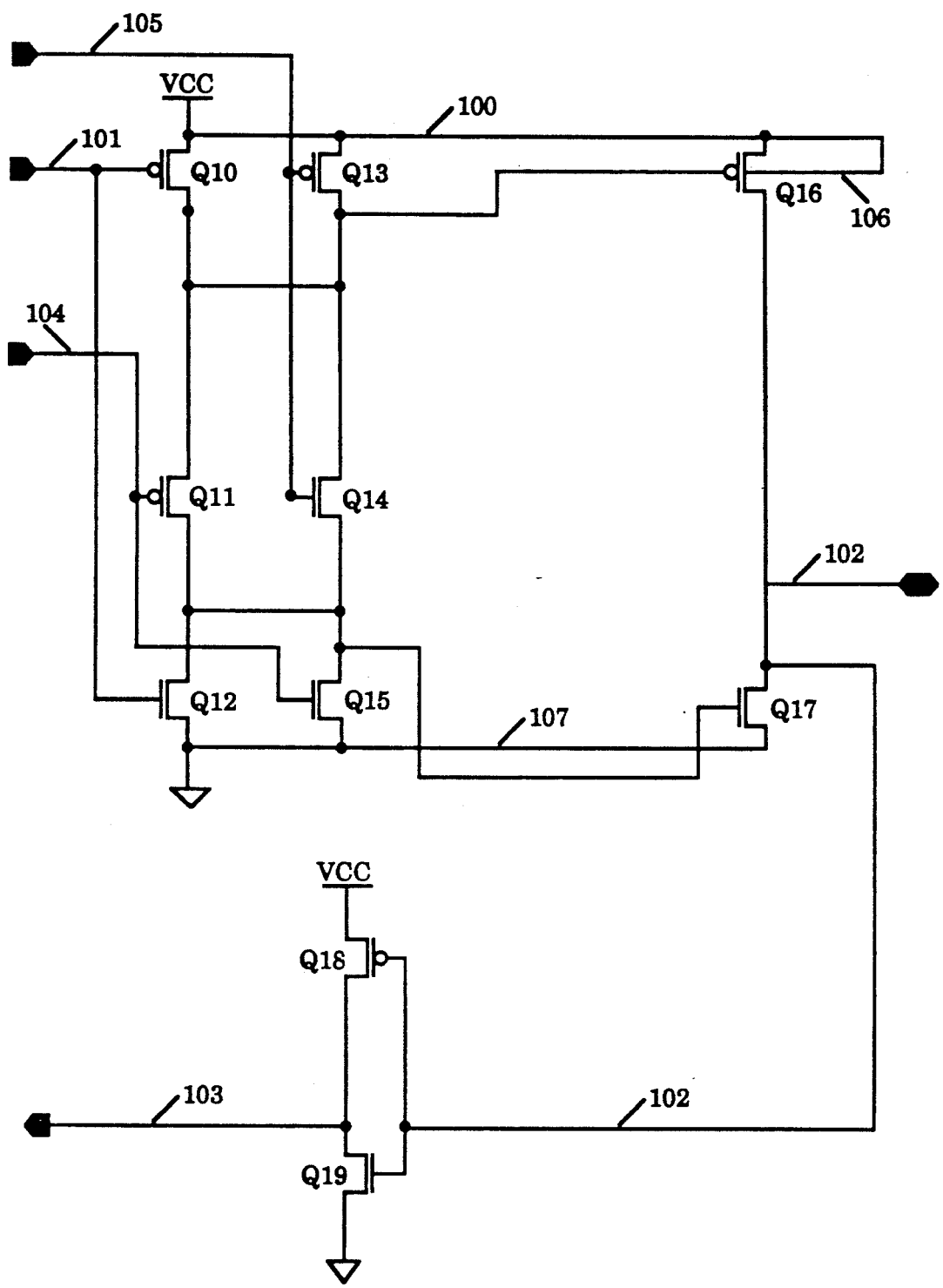
FIG. 1 illustrates a typical prior art input/output circuit for an integrated circuit, and shows the transistors that are vulnerable to breakdown when exposed to high voltages.
Figure 2:
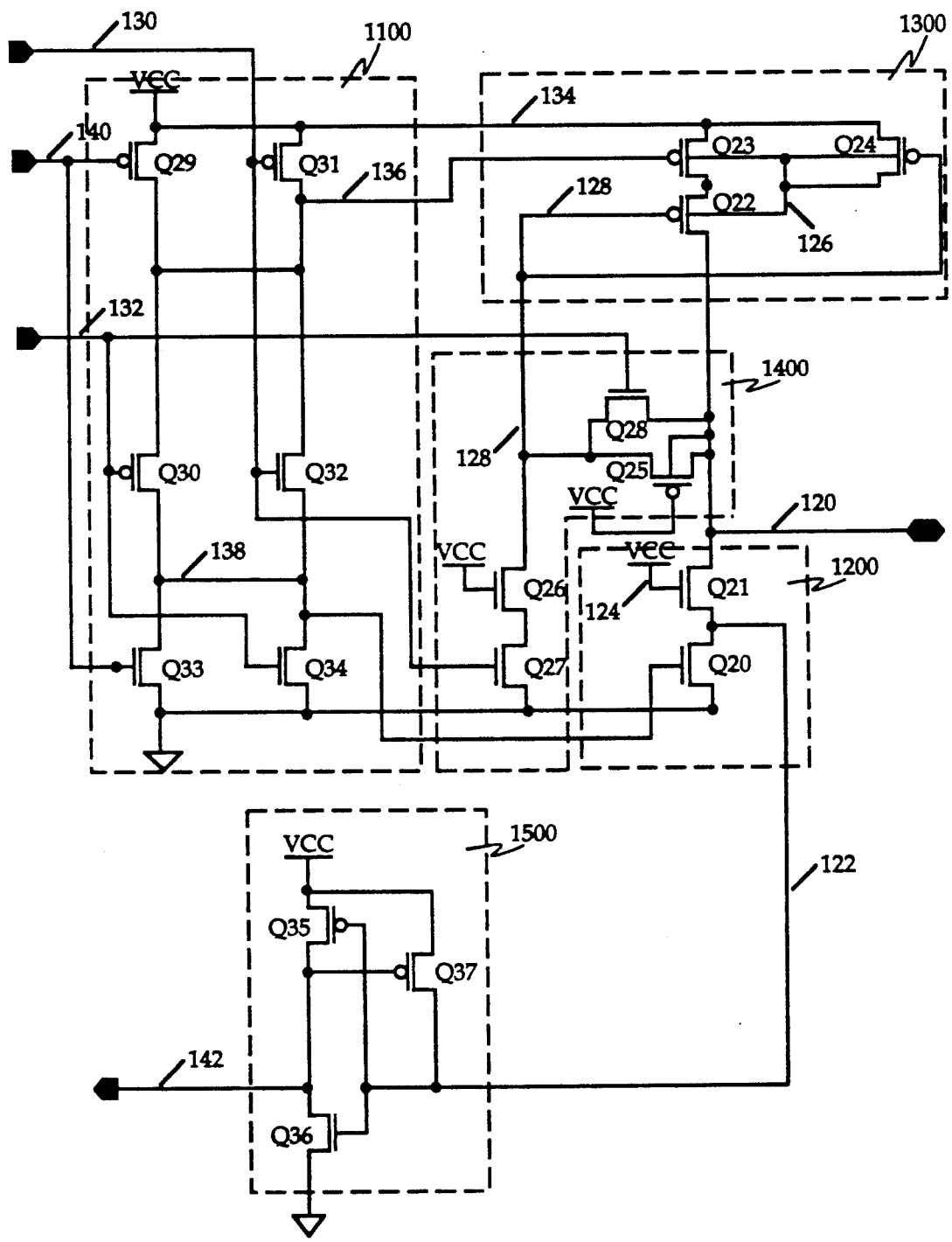
FIG. 2 illustrates one embodiment of a voltage interfacing circuit for interfacing an integrated circuit operating with a VCC supply voltage to a higher voltage environment.

FIG. 2 illustrates one embodiment of a voltage interfacing circuit for interfacing an integrated circuit operating with a VCC supply voltage to a higher voltage environment. For one embodiment, the integrated circuit operates at a VCC substantially equal to 3.3 V. The voltage interfacing circuit enables the integrated circuit to drive a higher voltage circuit or bus that recognizes VCC voltage level swings. For example, the voltage interfacing circuit enables the integrated circuit to drive a TTL level bus. The voltage interfacing circuit is comprised of a tri-state control section, an output pull-down section, an output pull-up section, an output pull-up control circuit, and an input section.

The tri-state control section 1100 is comprised of p-channel transistors Q29, Q30 and Q31, as well as n-channel transistors Q32, Q33, and Q34, The tri-state mode is determined by a pair of complementary output enable signals: output enable (OE) at a node 130, and output enable bar (OEB) at a node 132. When the circuit is in tri-state mode, the OE 130 is low and the OEB 132 is high. The low voltage at OE 130 switches on the transistor Q31 to pull up the voltage at a node 136. The high voltage at the node 136 prevents an output pull-up transistor Q23 from switching on. The high voltage at the OEB 132 switches on the transistor Q34 to pull down the voltage at a node 138. The low voltage at the node 138 prevents an output pull-down transistor Q20 from switching on.

When the circuit is in drive mode, the OE 130 is high and the OEB 132 is low. A voltage level at an output data node 140 indicates output data for the corresponding pin of the integrated circuit. The output data node 140 is coupled to the gates of the transistors Q29 and Q33. If the output data and output data node 140 is high, the transistor Q33 pulls the node 136 low through the transistor Q30 and Q32 in drive mode. A low voltage at the node 136 switches on the output pull-up transistor Q23. If the output data and output data node 140 is low, the transistor Q29 pulls the node 138 high through the transistor Q30 and Q32 in drive mode. A high voltage at the node 138 switches on the pull-down transistor Q20.

The output pull-down section 1200 is comprised of the n-channel pull-down transistor Q20 and an n-channel transistor Q21. The transistor Q21 protects the pull-down transistor Q20 from over-voltage. The gate of the transistor Q21 is coupled to VCC. The transistor Q21 prevents a node 122 from rising above about 2 V, since the gate of the transistor Q21 is at VCC. As a consequence, the maximum voltage across an output node 120 and the node 122 is about 3 V (in the case when node 120 is driven by another device to 5 V). The maximum voltage across the transistor Q21 gate oxide layer between the nodes 120 and 124 is 3.3 V (when the node 120 is at 0 V), or 1.7 V (when the node 120 is at 5 V). The maximum voltage across the node 122 and the node 124 is 3.3 V.

The output pull-up section 1300 is comprised of a p-channel transistor Q22, the output pull-up p-channel transistor Q23, and a p-channel transistor Q24. The n-well of the transistor Q22 is floating rather than connected to VCC as is usually done. If the n-well 126 were connected to VCC, the p-n junction between the drain and the n-well of the transistor Q22 would cause massive currents as the voltage at the output node 120 rises toward 5 V.

However, the voltage at the n-well 126 rises above VCC as the voltage at output node 120 rises toward 5 V because the n-well 126 is not connected to VCC. As a result, the junction isolations around the p-channel transistors Q22, Q23 and Q24 stays functional. When the circuit is driving out ever output node 120, transistor Q24 drives the n-well 125 towards VCC. In tri-state mode, the n-well 126 either remains at VCC, or p-n junction between a node 134 and the n-well 126 drives the node 126 to VCC minus one diode drop. If the voltage level at the output node 120 goes high, the n-well 126 is driven to the voltage at the output node 120 minus one diode drop.

The output pull-up control circuit 1400 is comprised of transistors Q25 through Q28. It will be appreciated that if the voltage at the output node 120 reaches 5 V, the voltage at the n-well 126 will reach 4.5 volts. In such a case, the transistor Q22 might switch on during tri-state mode. However, the p-channel transistor Q25 switches on as the output node 120 rises to 5 V since the gate of the transistor Q25 is coupled to VCC. The transistor Q25 switches on and pulls the node 128 to the 5 V level of the output node 120. The 5 V level at the node 128 prevents the transistor Q22 from switching on, thereby ensuring the circuit remains in tri-state mode. The transistor Q28 assists in the charging of the node 128 from the node 120.

A pair of n-channel transistors Q26 and Q27 ensure that the transistor Q22 switches on when the tri-state mode is canceled after the high voltage state at output node 120 and node 128. When the tri-state mode is canceled, the OE 130 goes high and the OEB 132 goes low. The high voltage at the OE 130 causes the transistor Q27 to switches on and pull the node 128 low through the switched on transistor Q26.

The input section 1500 is comprised of p-channel transistors Q35 and Q37, and n-channel transistor Q36. The transistor Q35 pulls up the voltage at an input data node 142 when the voltage at the node 122 is low. The transistor Q36 pulls down the voltage at the input data node 142 when the voltage at the node 122 is high. The node 122 has a limited voltage swing due to the protection of the transistor Q21. The p-channel transistor Q37 is coupled to provide feedback to node 122. The transistor Q37 provides full VCC voltage swing for the node 122.

Figure 3A:
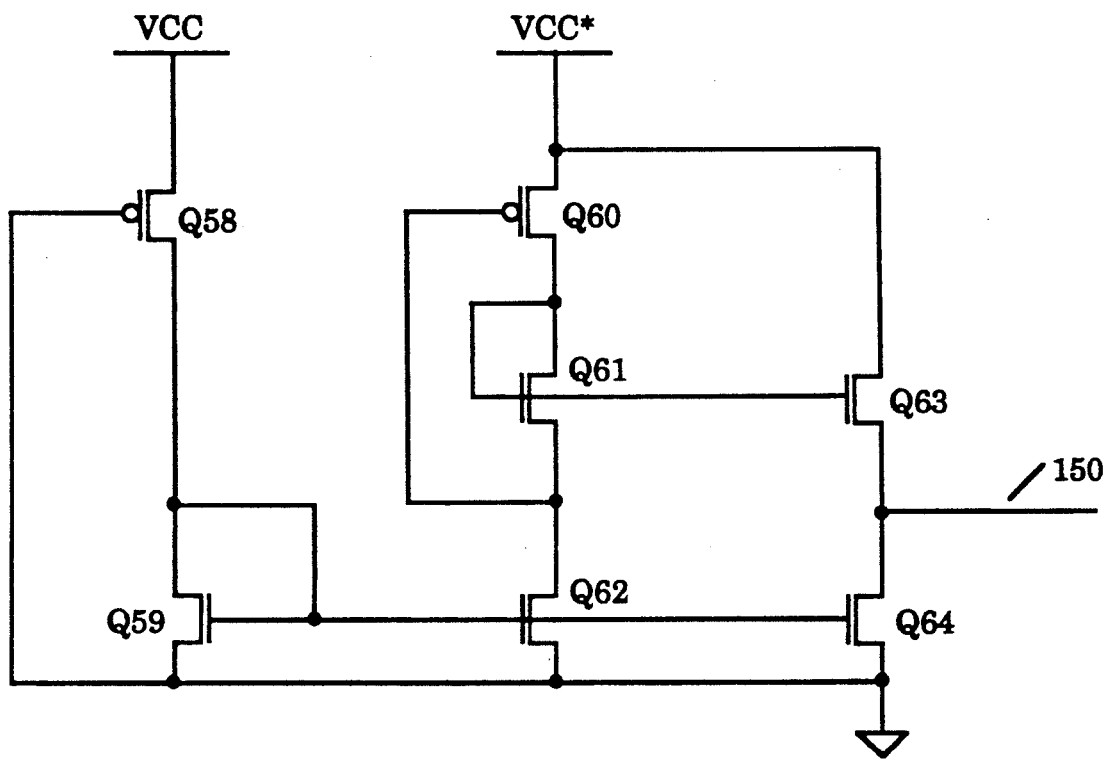
FIGS. 3a-3c illustrate an alternative embodiment of a voltage interfacing circuit that enables an integrated circuit operating with a VCC supply voltage to drive a circuit or bus at a higher VCC* voltage swing.
Figure 3B:
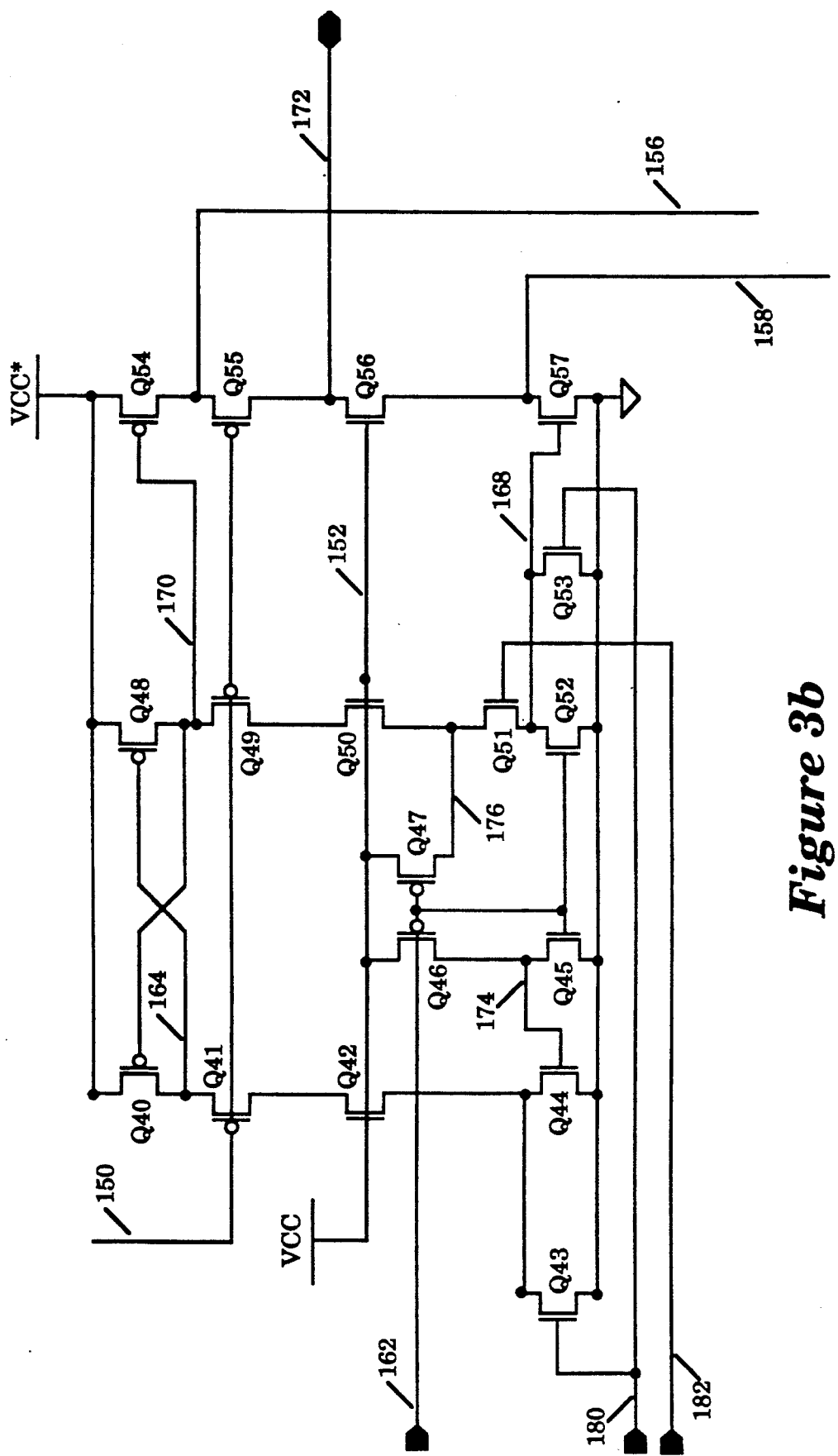
Figure 3C:
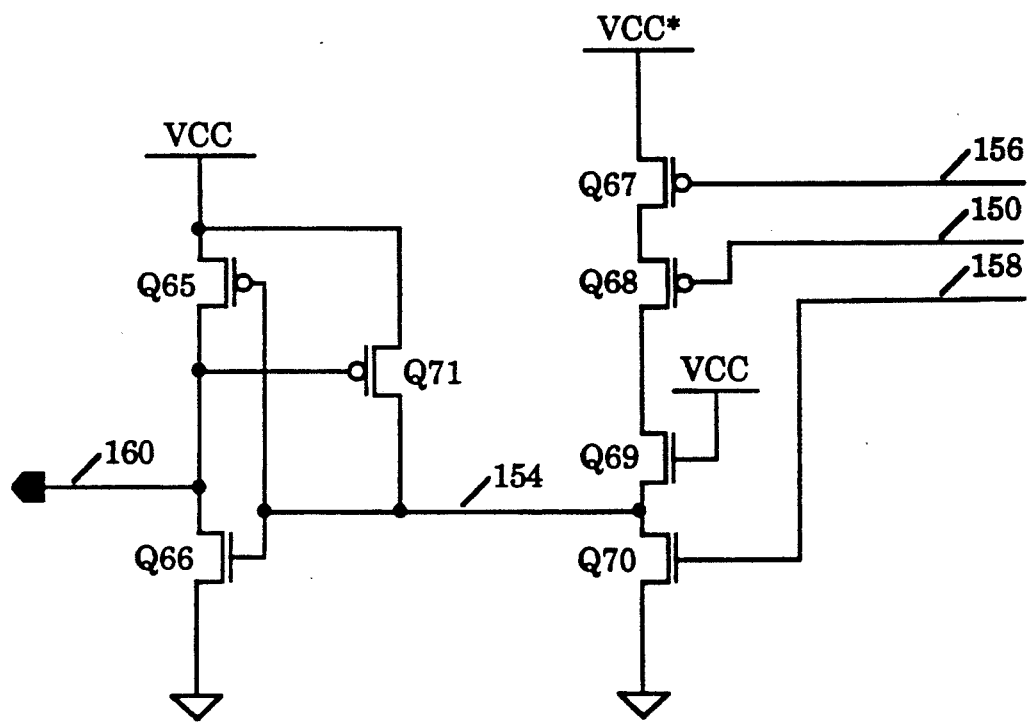

FIGS. 3a–3c illustrate an alternative embodiment of a voltage interfacing circuit. The circuit illustrated enables an integrated circuit that operates with a VCC supply voltage to drive a circuit or bus at higher VCC* voltage swings. For one embodiment, VCC is substantially equal to 3.3 V and VCC* substantially equal to 5 V. All of the transistor contained on the integrated circuit are designed for the VCC supply voltage. The circuit is comprised of a $P_{bias}$ section, an output section with tri-state control, and an input section.

The VCC supply voltage is provided by a VCC supply voltage pin of the integrated circuit. The VCC* supply voltage may be generated on the integrated circuit by a voltage multiplier circuit. Alternatively, the VCC* supply voltage may be supplied through a VCC* supply voltage pin of the integrated circuit.

FIG. 3a illustrates the $P_{bias}$ section, which generates a $P_{bias}$ voltage 150. The $P_{bias}$ section is comprised of n-channel transistors Q59, Q61, Q62, Q63 and Q64, and p-channel transistors Q58 and Q60. Transistor Q58 is a current source for the $P_{bias}$ section. Transistors Q59, Q60, Q62 and Q64 are current mirrors controlled by the current source.

The $P_{bias}$ 150 voltage is substantially equal to the difference between the supply voltage VCC and a supply voltage VCC*. As is discussed fully below, the $P_{bias}$ 150 is used to protect transistors contained in the input and output sections.

FIG. 3b illustrates the output section, which is comprised of transistors Q40 through Q57. The tri-state mode is determined by an OE 182, and an OEB 180. The OEB 180 is the complement of the OE 182. When the circuit is in tri-state mode, the OE 182 is low and the OEB 180 is high. The output section receives output data for a pin of the integrated circuit at an output data node 162. The output section drives the output data over an output node 172.

The n-channel transistor Q56 protects the pull-down n-channel transistor Q57 from over-voltage. The gate of the transistor Q56 is coupled to VCC at a node 152. Even if the voltage at the output node 172 reaches 5 V, the transistor Q56 prevents a node 158 from rising above about 2 V. As a consequence, the maximum voltage across the output node 172 and the node 158 is about 3 V. The maximum gate oxide layer voltage for the transistor Q56 across the output node 172 and the node 152 is 3.3 V (when the output node 172 is at 0 V), or 1.7 V (when the output node 172 is at 5 V). The maximum voltage across the node 158 and the node 152 is 3.3 V.

In a similar manner, the p-channel transistor Q55 protects the p-channel pull-up transistor Q54 from over-voltage. The gate of the transistor Q55 is coupled to the $P_{bias}$ 150. The $P_{bias}$ voltage level at the gate of the transistors Q55 ensures that the voltages applied to the gate oxide layers of the transistors Q54 and Q55 remain below 3.3 V.

Transistors Q40–Q53 function as a differential level converter between a VCC voltage swing at the output data node 162 and a VCC* voltage swing at intermediate nodes 168 and 170. A high voltage level at the output data node 162 causes the n-channel transistors Q45 and Q52 to switch on and pull down nodes 174 and 168.

A low voltage at the output data node 162 causes p-channel transistors Q46 and Q47 switch on and pull up the nodes 174 and 176. A high voltage at the node 174 switches on the n-channel transistor Q44, which results in current flow through the p-channel transistor Q41 and the n-channel transistor Q42. The current flow through the transistors Q41 and Q42 pulls down the voltage at a node 164. The low voltage at the node 164 causes the p-channel transistor Q48 to switch on.

The transistors Q40 and Q48 ensure the restoration of voltage levels at nodes 164 and 170 in order to switch off the transistors Q48 and Q54. When the transistor Q48 switches on, current flow through the transistor Q48 causes current flow through the transistors Q49, Q50 and Q51, which causes the node 168 to go high. A high voltage level at the node 168 switches on transistor Q57 to pull down the output node 172. Current flow through transistor Q48 also causes node 170 to go high. The high voltage level at node 170 switches off the transistor Q54.

When the output data node 162 goes to a high voltage, the transistor Q52 switches on and pulls down the node 168. The low voltage at the node 168 switches off transistor Q57. When the node 170 goes to a lower voltage level than VCC*, the transistor Q54 switches on. The low voltage at the node 170 also causes the transistor Q40 to switch on and transistor Q48 to switch off.

FIG. 3c illustrates the input section, which is comprised of transistors Q65 through Q71. Inputs are taken from the nodes 156 and 158. The p-channel transistors Q67 and Q68, and the n-channel transistors Q69 and Q70 function as a level converter between the VCC* voltage swing of nodes 156 and 158 and the VCC voltage swing of an input data node 160.

An n-channel transistor Q69 protects an n-channel pull-down transistor Q70. The gate of the transistor Q69 is coupled to VCC. A p-channel transistor Q68 protects a p-channel pull-up transistor Q67. The gate of the transistor Q68 is coupled to the $P_{bias}$ 150.

The p-channel transistor Q65 pulls up the voltage at the input data node 160 when the voltage at a node 154 is low. The transistor Q66 pulls down the voltage at the input data node 160 when the voltage at the node 154 is high. The p-channel transistor Q71 is coupled to provide feedback to node 154. The transistor Q71 provides full VCC voltage swing for the node 154.

While the present invention has been described in terms of current embodiments, those skilled in the art will recognize that the invention is not limited to the embodiment described. The method and apparatus of the present invention can be practiced with modification and alteration within the spirit and scope of the appended claims. The description is thus to be regarded as illustrative instead of restrictive on the present invention.

What is claimed is:

1. A voltage interfacing circuit for interfacing an integrated circuit operating at a first supply voltage (VCC) to a pad node having a voltage swing substantially equal to a second supply voltage (VCC*), where the VCC* is greater than the VCC, the integrated circuit having an input data node and an output data node, the voltage interfacing circuit comprising:
    bias generator circuit coupled to the VCC and the VCC*, the bias generator circuit generating a bias signal substantially equal to the difference between the VCC* and the VCC;
    output circuit coupled to the output data node, the bias signal and the pad node, the output circuit driving the pad node to the VCC* voltage swing in response to an output voltage on the output data node, the output circuit using the bias signal to protest the output circuit from the VCC* voltage swing of the pad node; and
    input circuit coupled to the input data node, the bias signal, and the pad node, the input circuit sensing a voltage on the pad node, the input circuit using the bias signal to protect the input circuit from the VCC* voltage swing of the pad node the input circuit setting an input voltage level on the input data node according to the voltage on the pad node.

2. The voltage interfacing circuit of claim 1, wherein the output circuit comprises:
    output pull-down circuit coupled to the pad node, the output pull-down circuit driving the pad node to a low voltage; and
    output pull-up circuit coupled to the pad node, the output pull-up circuit driving the pad node to the VCC*, the output pull-up circuit using the bias signal to protect the output pull-up circuit from the VCC* voltage swing of the pad node.

3. The voltage interfacing circuit of claim 1, further comprising voltage level conversion circuit coupled to receive the bias signal, the voltage level conversion circuit converting between the VCC voltage swing on the output data node and the VCC* voltage swing on a pair of intermediate nodes.

4. The voltage interfacing circuit of claim 3, wherein the voltage level conversion circuit causes the output circuit to drive the pad node to the low voltage if an output enable signal is in a first state and the output data node is in a second state, the voltage level conversion circuit preventing the output circuit from driving the pad node to the low voltage if the output enable signal is in the second state.

5. The voltage interfacing circuit of claim 3, wherein the voltage level conversion circuit causes the output circuit to drive the pad node to the VCC* if the output enable signal is in a first state and the output data node is in the first state, the voltage level conversion circuit preventing the output pull-up circuit from driving the pad node to the VCC* if the output enable signal is in the second state.

6. The voltage interfacing circuit of claim 2, wherein the output pull-down circuit comprises:
    first transistor means coupled between the pad node and a first node, the first transistor means having a control input coupled to the VCC;
    second transistor means coupled between the first node and a common node, the second transistor means having a control input for causing the first and second transistor means to drive the pad node to the low voltage.

7. The voltage interfacing circuit of claim 6, wherein the output pull-up circuit comprises:
    third transistor means coupled between the VCC* and a second node, the third transistor means having a control input for causing the third transistor means to drive the pad node to the VCC*;
    fourth transistor means coupled between the second node and the pad node, the fourth transistor means having a control input coupled to the bias signal.

8. The voltage interfacing circuit of claim 7, wherein the input circuit comprises:
    fifth transistor means coupled between the VCC* and a third node, the fifth transistor means having a control input coupled to the second node;
    sixth transistor means coupled between the third node and a fourth node, the sixth transistor means having a control input coupled to the bias signal;
    seventh transistor means coupled between the fourth node and a fifth node, the seventh transistor means having a control input coupled to the VCC;
    eighth transistor means coupled between the fifth node and the common node, the eighth transistor means having a control input coupled to the first node;
    ninth transistor means between the fifth node and the VCC, the ninth transistor means having a control input coupled to the input data node;
    tenth transistor means between the VCC and the input data node, the tenth transistor means having a control input coupled to the fifth node;
    eleventh transistor means between the input data node and the common node, the eleventh transistor means having a control input coupled to the fifth node.

9. A voltage interfacing circuit for interfacing an integrated circuit having an output data node and an input data node to a pad node having a high voltage swing, the voltage interfacing circuit protecting the integrated circuit from the high voltage swing, the voltage interfacing circuit comprising:
    output pull-down circuit coupled to the pad node, the output pull-down circuit driving the pad node to a low voltage in response to a first voltage level on the output data pad, the output pull-down circuit protecting the integrated circuit from the high voltage swing of the pad node;
    output pull-up circuit coupled to the pad node, the output pull-up circuit driving the pad node to the high voltage swing level in response to a second voltage level on the output data pad, the output pull-up circuit protecting the integrated circuit from the high voltage swing of the pad node, the output pull-up circuit further including:
        first transistor means coupled between a voltage source (VCC) for the integrated circuit and a first node, the first transistor means having a control input for causing the first transistor means to drive the pad node to the third voltage level, the first transistor means having an n-well coupled to an independent node;

second transistor means coupled between the first node and the pad node, the second transistor means having a control input coupled to a second node, the second transistor means having an n-well coupled to the independent node;

third transistor means coupled between the VCC and the independent node, the third transistor means having a control input coupled to the second node, the third transistor means having an n-well coupled to the independent node;

output pull-up control circuit coupled to the pad node, the output pull-down circuit, the output pull-up circuit and the output data node, the output pull-up control circuit turning on the output pull-up circuit in response to, the second voltage level on the output data pad, and an output enable signal; and input circuit coupled to the input data node and the pad node, the input circuit sensing a voltage on the pad node, the input circuit protecting the integrated circuit from the high voltage swing of the pad node, the input circuit setting an input voltage level on the input data node according to the voltage sensed on the pad node.

10. The voltage interfacing circuit of claim 9, further comprising: tri-state control circuit coupled to the output enable signal and the output data node, the tri-state control circuit causing the output pull-down circuit to drive the pad node to the low voltage if the output enable signal is at the second voltage level and the output data node is at the first voltage level, the tri-state control circuit preventing the output pull-down circuit from driving the pad node to the low voltage if the output enable signal is at the first voltage level.

11. The voltage interfacing circuit of claim 9, further comprising:

tri-state control circuit coupled to the output enable signal and output data node, the tri-state control circuit causing the output pull-up circuit to drive the pad node to the high voltage level if the output enable signal is at the second voltage level and the output data node is at the second voltage level, the tri-state control circuit. preventing the output pull-up circuit from driving the pad node to the high voltage level if the output enable signal is at the first voltage level.

12. The voltage interfacing circuit of claim 9, wherein the output pull-down circuit comprises:

fourth transistor means coupled between the pad node and a first node, the first transistor means having a control input coupled to a voltage source (VCC) for the integrated circuit;

fifth transistor means coupled between the first node and a common node, the second transistor means having a control input for causing the first and second transistor means to drive the pad node to the low voltage.

13. The voltage interfacing circuit of claim 9, wherein the output pull-up control circuit comprises:

fourth transistor means coupled between the second node and the pad node, the fourth transistor means having a control input coupled to an inverted output enable signal;

fifth transistor means coupled between the second node and the pad node, the fifth transistor means having a control input coupled to the VCC; and six and seventh transistor means coupled in series between the second node and a common node, the sixth transistor means having a control input coupled to the VCC, the seventh transistor means having a control input coupled to the output enable signal.

14. A method for interfacing an integrated circuit operating at a first supply voltage (VCC) to a pad node operating at a second supply voltage (VCC*), where VCC* is greater than VCC, the integrated circuit having an input data node and an output data node, the method comprising the steps of:

generating a bias signal substantially equal to the difference between the VCC and a second supply voltage (VCC*) greater than the VCC;

driving the pad node to the VCC* voltage swing in response to an output voltage on the output data node, while using the bias signal to protect the integrated circuit from the VCC* voltage swing of the pad node; and setting an input voltage level on the input data node in response to a voltage sensed on the pad node while using the bias signal to protect the integrated circuit from the VCC* voltage swing of the pad node.

15. The method of claim 14, further comprising the step of converting between the VCC voltage swing on an output data node and the VCC* voltage swing on the output pad.

* * * * *